United States Patent
Clerc et al.

(10) Patent No.: US 10,048,317 B2
(45) Date of Patent: Aug. 14, 2018

(54) METHOD AND DEVICE FOR TESTING A CHAIN OF FLIP-FLOPS

(71) Applicant: STMicroelectronics (Crolles 2) SAS, Crolles (FR)

(72) Inventors: Sylvain Clerc, Grenoble (FR); Gilles Gasiot, Seyssinet-Pariset (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/244,586

(22) Filed: Aug. 23, 2016

(65) Prior Publication Data
US 2017/0227602 A1 Aug. 10, 2017

(30) Foreign Application Priority Data
Feb. 5, 2016 (FR) ...................................... 16 50947

(51) Int. Cl.
*G01R 31/3177* (2006.01)
*G01R 31/317* (2006.01)

(52) U.S. Cl.
CPC ... *G01R 31/3177* (2013.01); *G01R 31/31703* (2013.01); *G01R 31/31723* (2013.01); *G01R 31/31727* (2013.01)

(58) Field of Classification Search
CPC ................................................. G01R 31/3185
USPC .................... 714/727, 724, 728, 738, 739
See application file for complete search history.

(56) References Cited

U.S. PATENT DOCUMENTS

| | | | |
|---|---|---|---|
| 5,574,733 A | 11/1996 | Kim | |
| 7,793,180 B1* | 9/2010 | Shrivastava | ... G01R 31/318541 714/726 |
| 7,975,195 B1* | 7/2011 | Joshi | ............. G01R 31/318541 714/727 |
| 8,006,156 B2* | 8/2011 | Kojima | .............. G01R 31/3016 324/500 |
| 8,381,144 B2* | 2/2013 | Jen | ........................ G06F 17/505 714/724 |
| 8,549,369 B2* | 10/2013 | Haufe | ............ G01R 31/318385 714/728 |

(Continued)

FOREIGN PATENT DOCUMENTS

WO WO-2015119541 A1 8/2015

OTHER PUBLICATIONS

Marshall, Paul et al: "Autonomous Bit Error Rate Testing at Multi-Gbit/s Rates Implemented in a 5AM SiGe Circuit for Radiation Effects Self Test (CREST)," IEEE Transactions on Nuclear Science, vol. 52, No. 6, Dec. 2005, pp. 2446-2454.

(Continued)

*Primary Examiner* — Fritz Alphonse
(74) *Attorney, Agent, or Firm* — Crowe & Dunlevy

(57) ABSTRACT

A chain of flip-flops is tested by passing a reference signal through the chain. The reference signal is generated from a test pattern that is cyclically fed back at the cadence of a clock signal. The reference signal propagates through the chain of flip-flops at the cadence of the clock signal to output a test signal. A comparison is carried out at the cadence of the clock signal of the test signal and the reference signal, where the reference signal is delayed by a delay time taking into account the number of flip-flops in the chain and the length of the test pattern. An output signal is produced, at the cadence of the clock signal, as a result of the comparison.

16 Claims, 4 Drawing Sheets

(56) References Cited

U.S. PATENT DOCUMENTS

2012/0137187 A1    5/2012  Jain et al.
2014/0245066 A1*   8/2014  Riviere-
                           Cazaux .......... G01R 31/318544
                                                       714/37

OTHER PUBLICATIONS

INPI Search Report and Written Opinion for FR 1650947 dated Sep. 26, 2016 (7 pages).

* cited by examiner

METHOD AND DEVICE FOR TESTING A CHAIN OF FLIP-FLOPS

PRIORITY CLAIM

This application claims priority from French Application for Patent No. 1650947 filed Feb. 5, 2016, the disclosure of which is incorporated by reference.

TECHNICAL FIELD

Various embodiments of the invention and their implementation relate to electronic test devices, and more particularly integrated test devices for performing an integrated self-test, commonly denoted by those skilled in the art under the acronym BIST (for Built In Self-Test), on a chain of flip-flops forming for example a shift register, or a scan chain.

BACKGROUND

Generally speaking, such an integrated test device designed to test a structure, for example a chain of flip-flops, comprises a test pattern generator configured for generating a series of known data, and a signal analyzer configured for comparing the series of known data and a test signal coming from the propagation of the series of data within the structure to be tested, and for delivering, for example, a bit error rate depending on the result of the comparison.

However, the length of the series of known data delivered by the generator is generally closely linked to the number of flip-flops in the structure to be tested.

In this respect, reference may be made to the document "Autonomous bit error rate testing at multi-gbits/s rates implemented in a 5 AM SiGe circuit for radiation effects self test (CREST)", P. Marshall, M. Carts, S. Currie, et al, IEEE Trans. Nucl. Sci., vol. 52, no. 6, pp. 2446-2454, December 2005 (incorporated by reference) which describes a test device comprising a test pattern generator whose length of the pattern is $2^7-1$, or 127 bits. This test device is consequently only compatible with a structure to be tested, for example a shift register, comprising 127 flip-flops.

In other words, such a conventional test device is not interchangeable for testing structures having different numbers of flip-flops.

SUMMARY

Thus, according to one embodiment and its implementation, a test device is provided which can be compatible with any length of chain of flip-flops to be tested.

According to one embodiment and its implementation, a technical solution with low complexity is provided using a test pattern whose length is independent of the number of flip-flops to be tested.

According to one aspect, a method is provided for testing a chain of flip-flops. This method comprising: generation of a reference signal from a test pattern cyclically fed back at the cadence of a clock signal; propagation of the reference signal through the chain of flip-flops at the cadence of the clock signal so as to generate a test signal at the output of the chain; a comparison carried out at the cadence of the clock signal between the test signal and the reference signal delayed by a delay time taking into account the number of flip-flops in the chain and the length of the test pattern; and generation of an output signal at the cadence of the clock signal whose value depends on the result of the comparison.

The generation of the reference signal may comprise the loading of the test pattern into a closed-loop chain of reference flip-flops and the sequencing of the reference flip-flops by the clock signal. The last reference flip-flop of the chain delivers the reference signal sequentially and cyclically at the cadence of the clock signal.

All the steps of the test method may advantageously be sequenced by the clock signal, for example a main clock signal at very high frequency, so as to improve the performance of the test.

By way of example, the generation of the reference signal may comprise a wait time of at least one cycle of the clock signal between the loading of the pattern and the sequencing of the reference flip-flops allowing the sequential and cyclical delivery of the reference signal.

The delay may for example correspond to a number of clock cycles of the clock signal. The number may be calculated by subtracting a number of clock cycles corresponding to a compensation of cycles from the sum of the number of flip-flops in the chain and of the number of reference flip-flops.

According to one embodiment, the method further comprises a step for configuring the chain of flip-flops with the possibility of selectively short-circuiting each flip-flop of the chain.

Such a configuration step allows the state of operation of each flip-flop of the chain to be verified and potentially defective flip-flops within the chain to be localized.

Advantageously, the number of flip-flops in the chain is independent of the length of the test pattern.

Such a technical characteristic allows tests to be carried out on various chains of flip-flops of different lengths without changing the test pattern.

According to another aspect, an electronic test device is provided for a chain of flip-flops. This device comprises: a generating circuit configured for generating a reference signal using a test pattern cyclically fed back at the cadence of a clock signal and for delivering the reference signal to the input of the chain of flip-flops; and a processing circuit configured for carrying out a comparison at the cadence of the clock signal between, on the one hand, a test signal delivered at the output of the chain of flip-flops and coming from the propagation of the reference signal within the chain and, on the other hand, the reference signal delayed by a delay time taking into account the number of flip-flops in the chain and the length of the test pattern, and for generating an output signal at the cadence of the clock signal whose value depends on the result of the comparison.

By way of non-limiting example, the generating circuit comprises a closed-loop chain of reference flip-flops and a first control circuit configured for carrying out the loading of the test pattern into the closed-loop chain of reference flip-flops then for enabling a sequencing of the reference flip-flops by the clock signal. The last reference flip-flop of the chain is configured for delivering the reference signal sequentially and cyclically at the cadence of the clock signal.

The fact that the generating circuit and the processing circuit may advantageously be sequenced by the clock signal, for example a main clock signal at very high frequency, allows the performance of the electronic test device with regard to the processing speed to be improved.

The first control circuit may for example be configured for applying a wait time of at least one cycle of the clock signal between the loading of the pattern and the sequencing of the reference flip-flops allowing the sequential and cyclical delivery of the reference signal.

The delay may correspond to a number of clock cycles of the clock signal, the number being equal to the sum of the number of flip-flops in the chain and of the number of reference flip-flops reduced by the number of clock cycles corresponding to a compensation of cycles.

According to one embodiment, the processing circuit comprises a counting circuit configured for counting the number of comparison errors between the test signal and the delayed reference signal.

The counting circuit may comprise a ring counter, for example of the Johnson counter type.

According to another embodiment, the device furthermore comprises a configuration circuit designed to selectively short-circuit each flip-flop of the chain.

The configuration circuit advantageously allows the state of operation of each flip-flop of the chain to be verified and potentially defective flip-flops to be localized within the chain.

By way of example, the device may further comprise a specific path for carrying the clock signal.

Such a specific path can advantageously avoid problems of clock tree skew in the transmission of the clock signal to each flip-flop of the chain.

According to yet another embodiment, the device comprises generating circuitry comprising three identical generating circuits connected in parallel and connected to a first majority vote circuit and processing circuitry comprising three identical processing circuits connected in parallel and connected to a second majority vote circuit.

Advantageously, such a three-fold structure can potentially avoid errors originating from the device itself.

BRIEF DESCRIPTION OF THE DRAWINGS

Other advantages and characteristics of the invention will become apparent upon studying the detailed description of embodiments and their implementation, taken by way of non-limiting examples and illustrated by the appended drawings in which.

DETAILED DESCRIPTION

Figure 1:
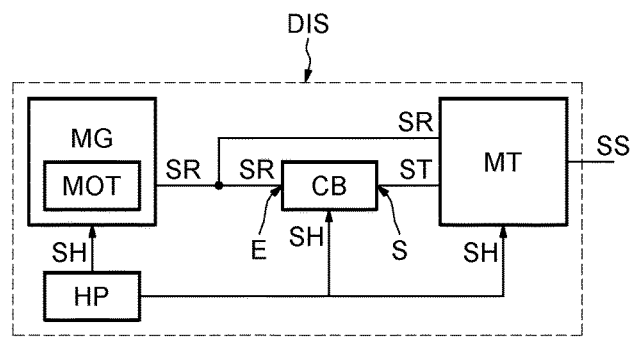
FIGS. 1 to 7 are schematic illustrations of various embodiments and their implementation.

FIG. 1 illustrates very schematically one example of an electronic test device DIS designed to test a chain of flip-flops CB, for example a chain of 10000 or even 80000 flip-flops.

The device DIS comprises a generating circuit MG configured for generating a reference signal SR from a test pattern MOT and for delivering the reference signal SR to the input E of the chain of flip-flops CB.

The test pattern MOT may advantageously be very short, for example a pattern of four bits, and is cyclically fed back at the cadence of a clock signal SH. The clock signal SH is supplied by a main clock HP, advantageously at high frequency, for example from 600 MHz to 1 GHz.

Upon receiving the reference signal SR at its input E, propagation of this reference signal SR is effected within the chain of flip-flops CB which is configured for delivering a test signal ST at its output S.

The device DIS further comprises a processing circuit MT connected, on the one hand, to the generating circuit MG and connected, on the other hand, to the output S of the chain CB and configured for performing a comparison at the cadence of the clock signal SH between the test signal ST and the reference signal SR which is delayed by a delay time taking into account the number of flip-flops in the chain CB and the length of the test pattern MOT.

The processing circuit MT is further configured for generating an output signal SS at the cadence of the clock signal SH. The value of the output signal SS depends on the result of the comparison.

Figure 2:
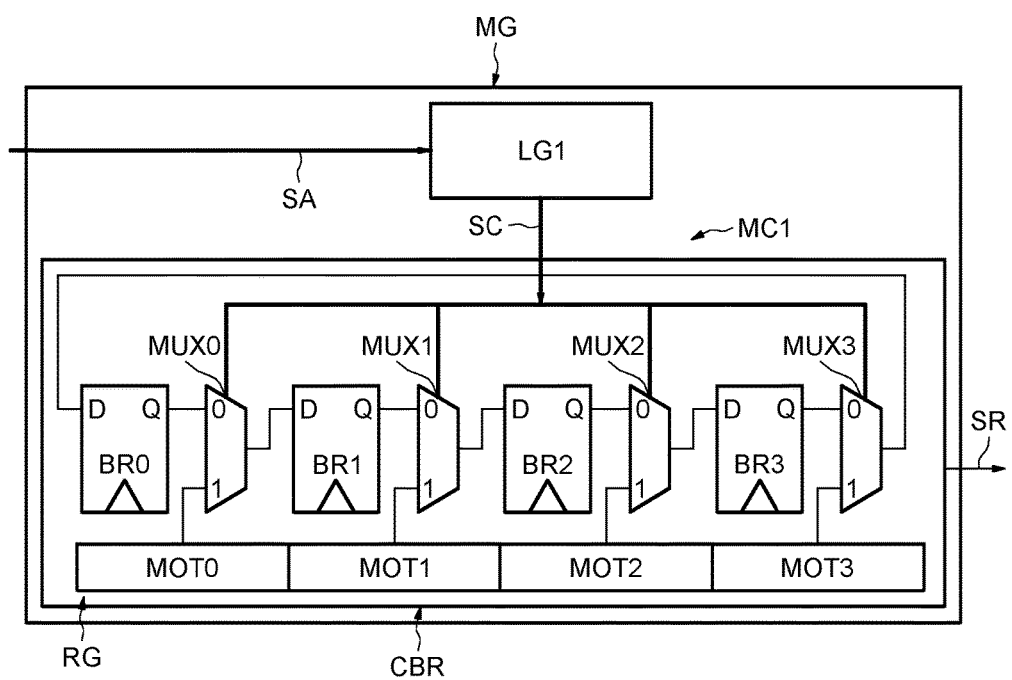

Reference is now made to FIG. 2 in order to illustrate in greater detail one example of the generating circuit MG, here comprising a closed-loop chain of reference flip-flops CBR, and first control circuit MC1 connected to the closed-loop chain CBR and configured for loading the test pattern MOT into the reference flip-flops CBR then for enabling a sequencing of the concatenated flip-flops CBR.

By way of example, the closed-loop chain of reference flip-flops CBR comprises four reference flip-flops BR0-BR3. The first control circuit MC1 comprises a control logic LG1, which behaves as a state machine, and multiplexers MUX0-MUX3 controlled by a control signal SC delivered by the control logic LG1.

The output Q of each reference flip-flop BR0-BR3 is connected to the input "0" of the multiplexer MUXi whose output is connected to the input D of the next flip-flop of the closed-loop chain CBR.

The first control circuit MC1 further comprises a register RG, here with four bits, each bit MOT0-MOT3 of which represents a bit of the test pattern MOT. The output of the register RG is coupled to the corresponding input "1" of the multiplexer MUX0-MUX3. The register RG may be configurable via an external bus.

Figure 3:
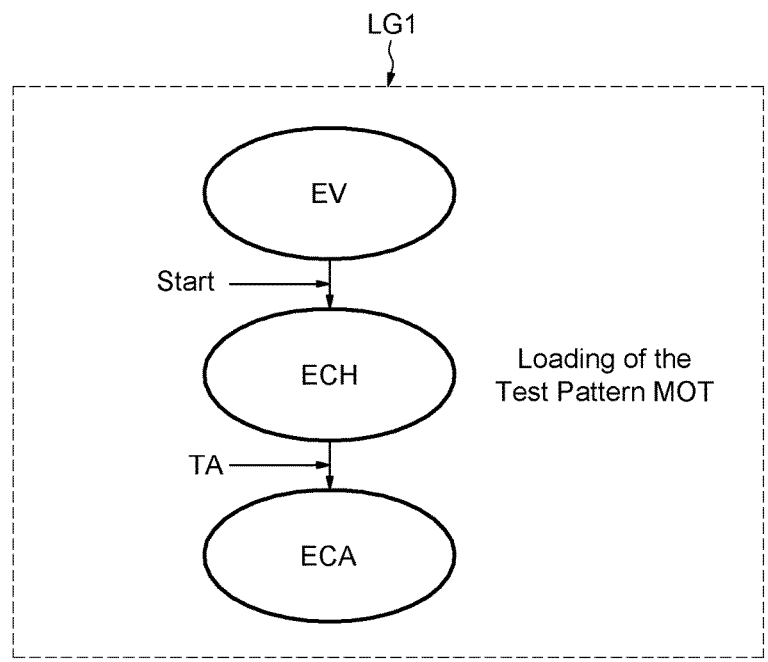

The control logic LG1 possesses three states: a standby state EV, a loading state ECH and a sequencing state ECA, as illustrated in FIG. 3.

Starting from the standby state EV, upon the arrival of an enable signal SA, the state machine switches into the loading state ECH.

Once in the loading state ECH, the control logic LG1 delivers the control signal SC with a value "1" to the multiplexers MUX0-MUX3. Consequently, the four bits of the register RG, in other words the test pattern MOT, are respectively loaded into the four reference flip-flops BR0-BR3.

The state machine is subsequently configured for applying a wait time TA prior to switching into the sequencing state ECA in which the control logic LG1 delivers the control signal SC equal to "0". The chain CBR is then fed back. The last reference flip-flop BR3 of the chain CBR generates the reference signal SR sequentially and cyclically at the cadence of the clock signal SH. The wait time TA can last for example for at least one cycle of the clock signal SH.

Figure 4:
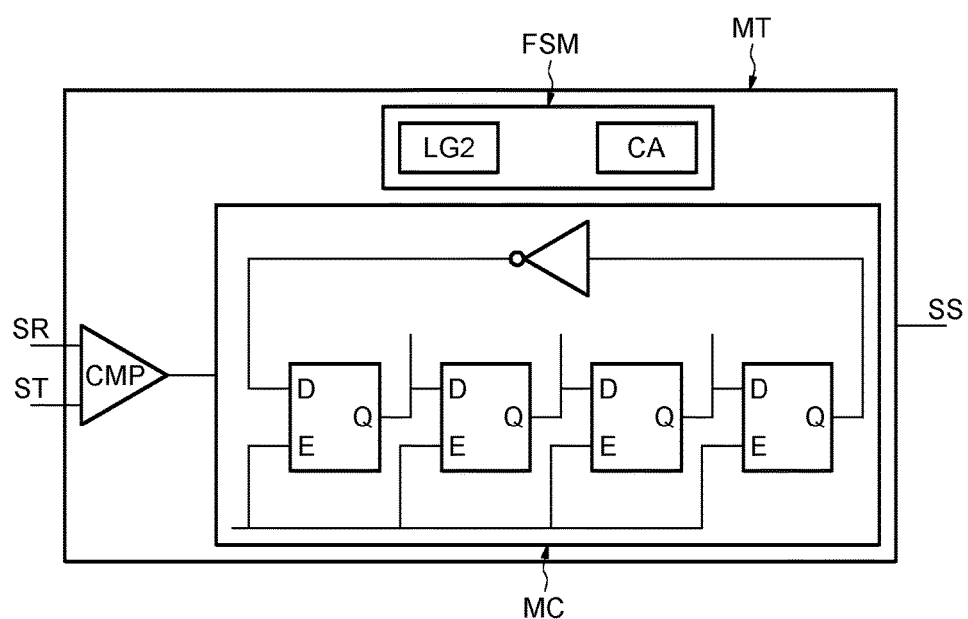

FIG. 4 illustrates schematically one example of the processing circuit MT.

The processing circuit MT comprises a comparison circuit CMP for comparing the test signal ST and the delayed reference signal SR, and a counting circuit MC configured for counting the number of errors in the comparison so as to generate the output signal SS.

The counting circuit MC may be implemented by using a conventional counter. Advantageously, a ring counter may also be used or else, more particularly, an inversion ring counter, for example a Johnson counter offering the dual advantage of twice the upper limit of a conventional ring counter and of a self-initialization. The output bit of a Johnson counter is inverted prior to being fed back onto its input, as illustrated in FIG. 4.

Figure 5:
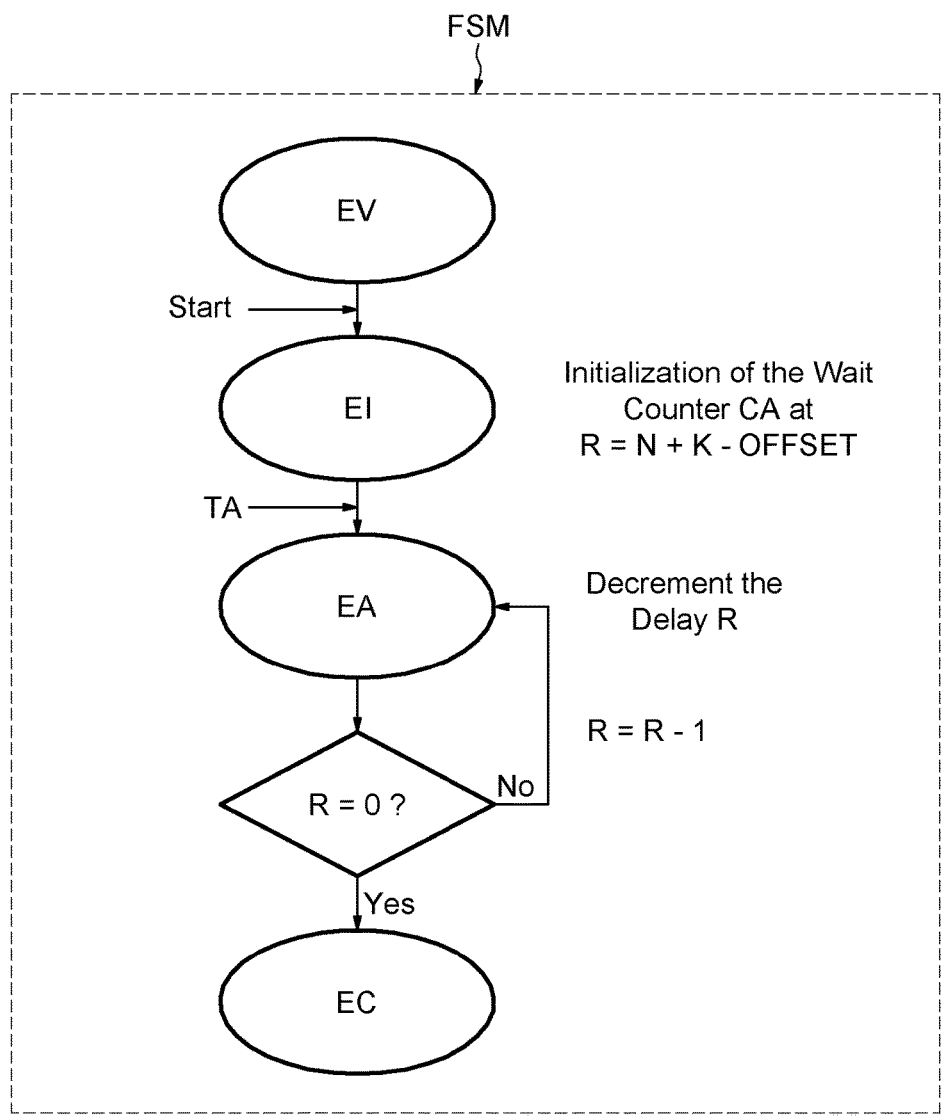

The processing circuit MT further comprises a control logic LG2 and a counter CA together forming a state machine FSM comprising four states: a standby state EV, an initialization state EI, a wait state EA, and a control state EC, as illustrated in FIG. 5.

The state machine FSM starts up by default in the standby state EV. It switches into the initialization state EI when the reference signal SR is received and the wait counter CA is initialized at a value equal to the delay R corresponding to a number of clock cycles of the clock signal SH. This number is equal to the sum of the number N of flip-flops in the chain CB and of the number K of reference flip-flops decremented by a number OFFSET of clock cycles corresponding to a compensation of cycles which depends on the implementation of the processing means MT. This compensation of cycles may for example last for one clock cycle of the clock signal SH.

The state machine FSM subsequently goes into the wait state EA after the wait time TA, here for example one cycle of the clock signal SH. During this wait state EA, the wait counter CA is decremented at the cadence of the clock signal SH.

When the value of the counter reaches the value zero, the state machine FSM switches into the control state EC allowing the control logic LG2 to enable the comparison circuit CMP in order to begin the comparison between the reference signal SR and the test signal ST, the counting circuit MC starting the counting of errors as a function of the result of the comparison.

It should be noted that the number N of flip-flops in the chain CB can be independent of the length of the test pattern MT, in other words the number K of reference flip-flops in the closed-loop chain CBR, since the test pattern MT is sequentially and cyclically repeated and the delay between the generation of the reference signal SR and the reception of the test signal is taken into account.

Such a technical feature advantageously allows the device DIS to be able to adapt to chains of flip-flops to be tested of different sizes and to do this even with an advantageously short test pattern.

Figure 6:
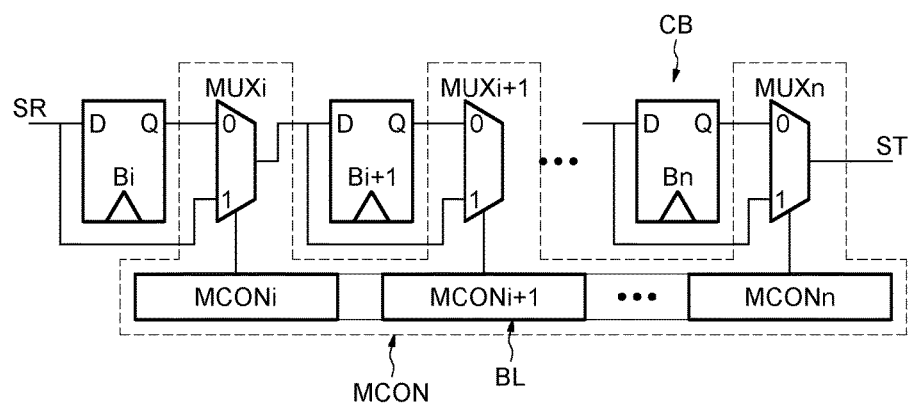

FIG. 6 illustrates another example of the chain of flip-flops CB according to one variant.

In such manner as to notably be able to detect which flip-flop is potentially defective, the device DIS further comprises a configuration circuit MCON designed to selectively short-circuit each flip-flop Bi of the chain CB.

By way of non-limiting example, after each flip-flop Bi of the chain CB, the configuration circuit MCON comprises a multiplexer MUXi whose input "0" is coupled to the output of the flip-flop Bi, whose input "1" is coupled to the input of the flip-flop Bi, and whose output is coupled to the input of the flip-flop Bi+1 following the multiplexer MUXi. The control inputs of the multiplexers are coupled, for example, to a logic bus BL carrying a control word MCONi-MCONn.

By setting a value "1" in a bit, for example the first bit, and a value "0" in the other bits of the control word MCONi-MCONn, the configuration circuit MCON short-circuits the corresponding flip-flop, for example the first flip-flop B1, of the chain CB.

Thus, if a fault signature is made to propagate within the chain CB and if this signature is not found in the test signal ST at the output S of the chain CB, the short-circuited flip-flop is defective.

By varying the values of the control word MCONi-MCONn, the configuration circuit can verify the state of operation of each flip-flop of the chain CB and advantageously potentially localize defective flip-flops within the chain CB. Once they have been localized, these defective flip-flops can be short-circuited so as to attenuate their influence on the test of the chain CB, or an inspection of the short-circuited flip-flop can be carried out in order to determine the cause of failure.

As a variant, in order to avoid any potential intrinsic errors coming from the electronic test device DIS, certain means of the device DIS may be "triplicated".

Figure 7:
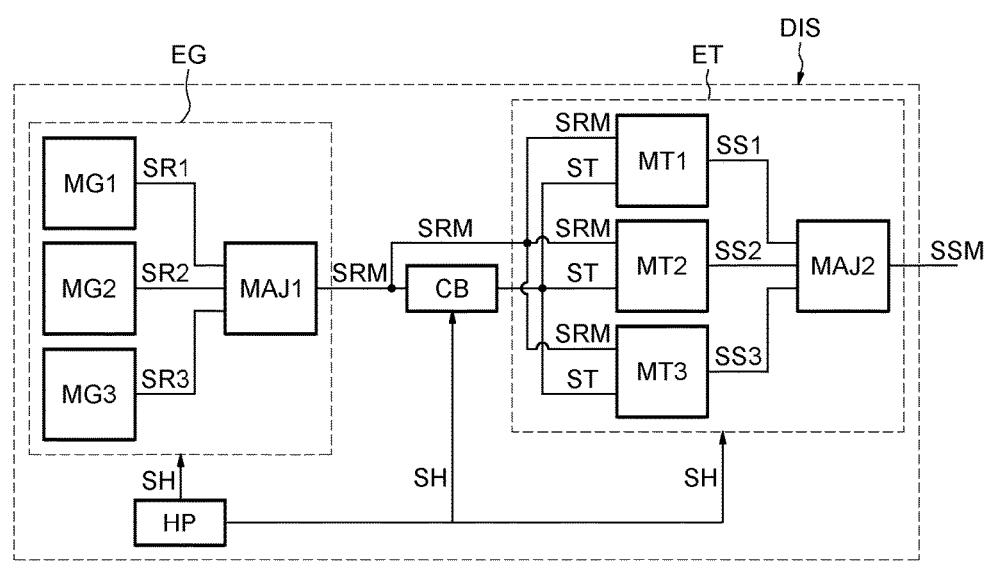

More precisely, the device DIS comprises (FIG. 7) generation stage circuitry EG comprising three identical generation circuits MG1-MG3 connected in parallel and connected to a first majority vote circuit MAJ1. The reference signals SR1-SR3 generated by these three generation circuits MG are delivered to the first majority vote circuit MAJ1 so as to generate a majority reference signal SRM according to a majority value from amongst the values of the three reference signals SR1-SR3.

The device DIS further comprises processing stage circuitry ET comprising three identical processing circuits MT1-MT3 connected in parallel and connected to a second majority vote circuit MAJ2. The majority reference signal SRM is respectively delivered to the chain and to the three processing circuits MT1-MT3. The output signals SS1-SS3 generated by these three processing circuits MT1-MT3 are delivered to the second circuit MAJ2 so as to generate a majority output signal SSM according to a majority value from amongst the values of the three output signals SS1-SS3.

It should be noted that all the circuits of the device DIS are timed by the same clock signal SH. For this reason, a specific path for carrying the clock signal to each circuit and, more particularly, to each flip-flop of the chain CB is particularly advantageous in order to avoid problems of clock tree skew. The specific path may be designed and determined prior to the application of the automatic routing tools.

An electronic device for testing a chain of flip-flops can be obtained that offers a high test speed, for example up to 1 GHz on a 28 nm fully depleted silicon-on-insulator, known by those skilled in the art under the acronym FDSOI, technology and a reduced size on silicon notably by virtue of the generating circuit comprising a closed-loop chain of reference flip-flops.

The invention claimed is:

1. A method for testing a chain of flip-flops, comprising:
   using generating circuitry to generate a reference signal from a test pattern that is cyclically repeated at a cadence of a clock signal,
   electrically coupling the reference signal through the chain of flip-flops at the cadence of the clock signal so as to generate a test signal at an output of the chain of flip-flops,
   using processing circuitry to compare, at the cadence of the clock signal, the test signal to the reference signal as delayed by a delay time taking into account a number of flip-flops in the chain of flip-flops and a length of the test pattern, and
   using the processing circuitry to generate an output signal at the cadence of the clock signal whose value depends on the result of the comparison.

2. The method according to claim 1, wherein using the generating circuitry to generate the reference signal comprises:
   loading the test pattern into a closed-loop chain of reference flip-flops,
   sequencing the reference flip-flops by the clock signal, and outputting from a last flip-flop in the chain of reference flip-flops the reference signal sequentially and cyclically at the cadence of the clock signal.

3. The method according to claim 2, wherein using the generating circuitry to generate the reference signal comprises applying a wait time of at least one cycle of the clock signal between the loading of the pattern and the sequencing of the reference flip-flops.

4. The method according to claim 3, wherein the delay time corresponds to a number of clock cycles of the clock signal, the number being a number of clock cycles corresponding to a compensation of cycles subtracted from a sum of the number of flip-flops in the chain of flip-flops and of the number of reference flip-flops.

5. The method according to claim 1, further comprising using a configuration circuit for selectively short-circuiting each flip-flop of the chain of flip-flops.

6. The method according to claim 1, wherein the number of flip-flops in the chain of flip-flops is independent of the length of the test pattern.

7. An electronic device for testing a chain of flip-flops, comprising:
    a generating circuit configured to generate a reference signal from a test pattern that is cyclically fed back at a cadence of a clock signal and deliver the reference signal to an input of the chain of flip-flops,
    a processing circuit configured to compare, at the cadence of the clock signal, a test signal generated at an output of the chain of flip-flops as a result of propagation of the reference signal within the chain of flip-flops to the reference signal delayed by a delay time taking into account a number of flip-flops in the chain of flip-flops and a length of the test pattern,
    said processing circuit further configured to generate an output signal at the cadence of the clock signal whose value depends on the result of the comparison.

8. The device according to claim 7, wherein the generating circuit comprises:

a closed-loop chain of reference flip-flops, and
    a first control circuit configured to load the test pattern into the closed-loop chain of reference flip-flops,
    wherein the reference flip-flops are sequenced by the clock signal and a last flip-flop in the chain of reference flip-flops is configured to output the reference signal sequentially and cyclically at the cadence of the clock signal.

9. The device according to claim 8, wherein the first control circuit is configured to apply a wait time of at least one clock cycle of the clock signal between the loading of the test pattern and the sequencing of the reference flip-flops.

10. The device according to claim 9, wherein the delay time corresponds to a number of clock cycles of the clock signal, the number being equal to a sum of the number of flip-flops in the chain of flip-flops and the number of reference flip-flops decremented by a number of clock cycles corresponding to a compensation of cycles.

11. The device according to claim 8, wherein the number of flip-flops in the chain of flip-flops is independent of the length of the test pattern.

12. The device according to claim 8, wherein the processing circuit comprises a counting circuit configured to count a number of comparison errors between the test signal and the delayed reference signal.

13. The device according to claim 12, wherein the counting circuit comprises a ring counter.

14. The device according to claim 8, further comprising a configuration circuit configured to selectively short-circuit each flip-flop of the chain of flip-flops.

15. The device according to claim 8, further comprising a specific path for carrying the clock signal.

16. The device according to claim 8, comprising:
    a generating stage comprising three identical generating circuits connected in parallel to each other and connected to a first majority vote circuit, and
    a processing stage comprising three identical processing circuits connected in parallel to each other and connected to a second majority vote circuit.

* * * * *